(12) United States Patent
Ghaleb (10) Patent No.: US 10,861,241 B2
(45) Date of Patent: Dec. 8, 2020

(54) FLOORPLAN VISUALISATION SYSTEM

(71) Applicant: Christopher Ghaleb, Strathfield (AU)

(72) Inventor: Christopher Ghaleb, Strathfield (AU)

( * ) Notice: Subject to any disclaimer, the term of this patent is extended or adjusted under 35 U.S.C. 154(b) by 0 days.

(21) Appl. No.: 16/333,822

(22) PCT Filed: Sep. 18, 2017

(86) PCT No.: PCT/AU2017/051017
§ 371 (c)(1),
(2) Date: Mar. 15, 2019

(87) PCT Pub. No.: WO2018/049485
PCT Pub. Date: Mar. 22, 2018

(65) Prior Publication Data
US 2019/0259210 A1    Aug. 22, 2019

(30) Foreign Application Priority Data
Sep. 16, 2016  (AU) ................. 2016903735

(51) Int. Cl.
*G09G 5/00* (2006.01)
*G06T 19/00* (2011.01)
*G03B 37/04* (2006.01)
*G06F 3/01* (2006.01)
*G06K 9/00* (2006.01)
(Continued)

(52) U.S. Cl.
CPC ............ *G06T 19/006* (2013.01); *G03B 37/04* (2013.01); *G06F 3/017* (2013.01); *G06F 30/13* (2020.01);
(Continued)

(58) Field of Classification Search
CPC . G06T 2210/04; G06T 19/006; G06T 19/003; G06T 2200/24; G06T 19/00;
(Continued)

(56) References Cited

U.S. PATENT DOCUMENTS 8,904,657 B1   12/2014  Kittrell
2005/0264555 A1  12/2005  Zhou et al.
(Continued)

FOREIGN PATENT DOCUMENTS

GB    2533201 A    6/2016
JP   2007187755 A   7/2007
(Continued)

OTHER PUBLICATIONS

Cave automatic virtual environment [retrieved from internet on Dec. 15, 2017] published on Jun. 29, 2016.
(Continued)

*Primary Examiner* — Weiming He
(74) *Attorney, Agent, or Firm* — Innovation Capital Law Group, LLP; Vic Lin (57) ABSTRACT

There is provided a floorplan visualisation system comprising a visualisation studio; a matrix of ceiling mounted edge-blended overlapping projectors projecting onto a floor surface of the visualisation studio; a controller computer comprising: a user interface; and a video output operably coupled to the matrix of projectors for controlling the video projected from such. In use the controller computer is configured for: receiving floor plan representative data; segmenting the floor plan representation data into a plurality of display segments; and outputting the plurality of display segments to respective projectors, and wherein the controller computer is configured to receiving scale adjustment commands via a scale adjustment control of the user interface and adjusting the scale of the segments to display a floor plan representation on the floor surface to a real world scale.

18 Claims, 2 Drawing Sheets

(51) Int. Cl.
  *G06T 7/20* (2017.01)
  *G06Q 50/08* (2012.01)
  *G06F 30/13* (2020.01)
  *G03B 21/14* (2006.01)
(52) U.S. Cl.
  CPC ......... *G06K 9/00335* (2013.01); *G06Q 50/08* (2013.01); *G06T 7/20* (2013.01); *G03B 21/14* (2013.01)
(58) Field of Classification Search
  CPC ......... G06T 2200/08; G06T 3/40; G06T 7/55; G06T 2207/20221; G06T 7/00; G06F 30/13; G06F 3/0482; G06F 3/04842; G06F 3/017; G06F 3/04883
  See application file for complete search history.

(56) References Cited

U.S. PATENT DOCUMENTS

| | | | |
|---|---|---|---|
| 2008/0007700 A1 | 1/2008 | vanBaar et al. | |
| 2008/0055554 A1 | 3/2008 | Tubin et al. | |
| 2008/0297740 A1 | 12/2008 | Huynh et al. | |
| 2009/0077504 A1* | 3/2009 | Bell | G06F 3/011 715/863 |
| 2010/0211897 A1 | 8/2010 | Cohen et al. | |
| 2013/0179841 A1 | 7/2013 | Mutton et al. | |
| 2014/0210856 A1* | 7/2014 | Finn | G06K 9/00671 345/633 |
| 2015/0321337 A1 | 11/2015 | Stephens, Jr. | |
| 2016/0057400 A1 | 2/2016 | Winter et al. | |

FOREIGN PATENT DOCUMENTS

| | | |
|---|---|---|
| WO | 2013170302 A1 | 11/2013 |
| WO | 2015192117 A1 | 12/2015 |

OTHER PUBLICATIONS

International Search Report dated Dec. 21, 2017 from PCT Application No. PCT/AU2017/051017.

Extended European Search Report dated Apr. 29, 2020 from European Application No. 17849933.1.

* cited by examiner

FLOORPLAN VISUALISATION SYSTEM

FIELD OF THE INVENTION

The present invention relates to a floorplan visualisation system.

DETAILED DESCRIPTION

Residential and/or commercial buildings and the like are built from floorplans which are drafted, inspected, and, if necessary adjusted prior building.

The floorplans are typically prepared according to a scale so as to allow the representation on A3 page format for example.

Prior construction, the floorplans are inspected and adjustments made accordingly. For example, the floorplans may be adjusted with reference to proposed furniture, appliances and/or other installations and according to the "feel" of the interior.

However, it is difficult to make such adjustments on paper format and sophisticated architectural 3D rendering software may be used not only to place the proposed installations but also provide a virtualisation of the interior.

However, utilisation of virtualisation software is not always adequate for determining the appropriateness of a layout or for making adjustments accordingly.

As such, a need exists for a way in which to overcome or at least ameliorate these disadvantages or at least provide an alternative.

SUMMARY OF THE DISCLOSURE

There is provided herein a floorplan visualisation system which, within a visualisation studio, comprises a matrix of ceiling mounted edge blended overlapping projectors projecting onto a floor surface of the visualisation studio. Furthermore, controller computer is utilised to load the floorplan data. The controller computer comprises a user interface and a video output operably coupled to the projectors for controlling the video projected from such.

As such, the controller computer is configured for segmenting the floorplan into a plurality of segments for display by each of the projectors onto the floor surface of the visualisation studio.

The controller computer is configured for adjusting the scale such that the displayed floor plan is to a real world scale. As such, users, such as prospective buyers and the like may walk around the displayed floor plan which, on account of being displayed at a real world scale, allows the user to more accurately gauge the feel and therefore appropriateness of the proposed layout within the visualisation studio. Additionally, real size physical objects, such as chairs, tables and other furniture and appliances may be placed on the floor surface for visual inspection thereof.

The controller computer may adjust the scale of the floorplan representative data accordingly for accuracy. For example, the user may utilise a user interface to make adjustments to the scale and, in embodiments, the controller computer may display a scale overlay that may be referenced when making such adjustment. In further embodiments, the controller may make interpret scale markings on the representation data or interpret scale meta data for the appropriate initial adjustment of the scale.

In further embodiments, the controller computer is configured for on-floor user interaction.

For example, in one embodiment, the controller computer is configured for ascertaining the location of a user on the floor surface, such as by utilising image analysis.

As such, and especially for floor plans which would not fit within the surface area available within the visualisation studio, the controller computer may pan the floorplan representation according to the position of the user.

Furthermore, the floorplan representative data may be enhanced with user interaction data at associated interaction areas of the floor plan representation. For example, user interaction area may represent a stairwell such that, when the position of the user is determined to coincide with the user interaction stairwell area, the controller computer may substitute the floor plan representation with a floor plan from the floor above or beneath accordingly. As such, the user may virtually walk between floors.

The controller computer may be configured for other aspects also, such as virtual furniture, appliance or the like placement movement substitution and the like. Additionally, the controller computer may allow the substitution of overlays so as to, for example, allow for the substitution of a carpet colour or the like within certain regions of the floorplan, such as the coral, kitchen area or the like.

As such, with the foregoing in mind, in accordance with one aspect, there is provided a floorplan visualisation system, the system comprising: a visualisation studio; a matrix of ceiling mounted edge-blended overlapping projectors projecting onto a floor surface of the visualisation studio; a controller computer comprising: a user interface; and a video output operably coupled to the matrix of projectors for controlling the video projected from such, wherein, in use: the controller computer is configured for: receiving floor plan representative data; segmenting the floor plan representation data into a plurality of display segments; outputting the plurality of display segments to respective projectors, and wherein the controller computer is configured to receiving scale adjustment commands via a scale adjustment control of the user interface and adjust the scale of the segments to display a floor plan representation on the floor surface to a real world scale.

The floorplan visualisation system further may comprise a user position monitoring subsystem for detecting a position of a user on the floor surface.

The system further may comprise an image capture device and wherein the position of the user may be determined utilising image processing of image data captured by the image capture device.

The controller may be configured for panning the floorplan representation according to the position of the user.

The controller computer may be further configured for receiving floor plan interaction data representative of at least one user interaction area on the floor plan representation and an associated interaction action, and, when detecting the coincidence of the position of the user and the at least one user interaction area, the controller computer may be configured for implementing the associated interaction action.

The associated interaction action may comprise replacing the floor plan representation with another floor plan representation.

The user interface may be a touch sensitive user interface configured for receiving on-screen user gestures and wherein the controller may be configured for projecting corresponding markings at respective locations of the floor plan representations.

The user interface may be a touch sensitive user interface configured for receiving on-screen cut and drag user gestures and wherein the controller may be configured manipulating subregions of the floor plan representation according to the cut and drag user gestures.

The controller computer may be configured for augmenting regions of the floor plan representation with at least one of a texture and colour overlay.

The controller computer may comprise a database of overlays and wherein, in use, the controller computer may be configured for receiving a selection of an overlay from the overlays via the user interface and augmenting a region of the floor plan representation utilising the selected overlay.

The floor plan representative data may comprise region representative meta data and wherein the controller computer may be configured for overlaying a region represented by the region representative meta data with the overlay.

The controller computer may be configured for determining the region representative meta data utilising image analysis of the floor plan representative data.

The controller computer may comprise a database of object representations and wherein, in use, the controller computer may be configured for receiving an object selection via the user interface and overlaying a representation of the object selection over the floorplan representation at a position specified using the user interface.

Other aspects of the invention are also disclosed.

BRIEF DESCRIPTION OF THE DRAWINGS

Notwithstanding any other forms which may fall within the scope of the present invention, preferred embodiments of the disclosure will now be described, by way of example only, with reference to the accompanying drawings in which.

DESCRIPTION OF EMBODIMENTS

For the purposes of promoting an understanding of the principles in accordance with the disclosure, reference will now be made to the embodiments illustrated in the drawings and specific language will be used to describe the same. It will nevertheless be understood that no limitation of the scope of the disclosure is thereby intended. Any alterations and further modifications of the inventive features illustrated herein, and any additional applications of the principles of the disclosure as illustrated herein, which would normally occur to one skilled in the relevant art and having possession of this disclosure, are to be considered within the scope of the disclosure.

Before the structures, systems and associated methods relating to the floorplan visualisation system are disclosed and described, it is to be understood that this disclosure is not limited to the particular configurations, process steps, and materials disclosed herein as such may vary somewhat. It is also to be understood that the terminology employed herein is used for the purpose of describing particular embodiments only and is not intended to be limiting since the scope of the disclosure will be limited only by the claims and equivalents thereof.

In describing and claiming the subject matter of the disclosure, the following terminology will be used in accordance with the definitions set out below.

It must be noted that, as used in this specification and the appended claims, the singular forms "a," "an," and "the" include plural referents unless the context clearly dictates otherwise.

As used herein, the terms "comprising," "including," "containing," "characterised by," and grammatical equivalents thereof are inclusive or open-ended terms that do not exclude additional, unrecited elements or method steps.

It should be noted in the following description that like or the same reference numerals in different embodiments denote the same or similar features.

In the embodiments that follow, there is provided a floorplan visualisation system 1. As will become apparent from the ensuing description, the system 1 is configured for allowing for the visualisation of floorplans, which, in a preferred embodiment, are scaled to real-world dimensions. As will be therefore be appreciated, the system 1 has application for allowing for pre-build inspection of proposed floorplans thereby preventing or reducing the likelihood of the requirement for post-construction modification.

Figure 1:
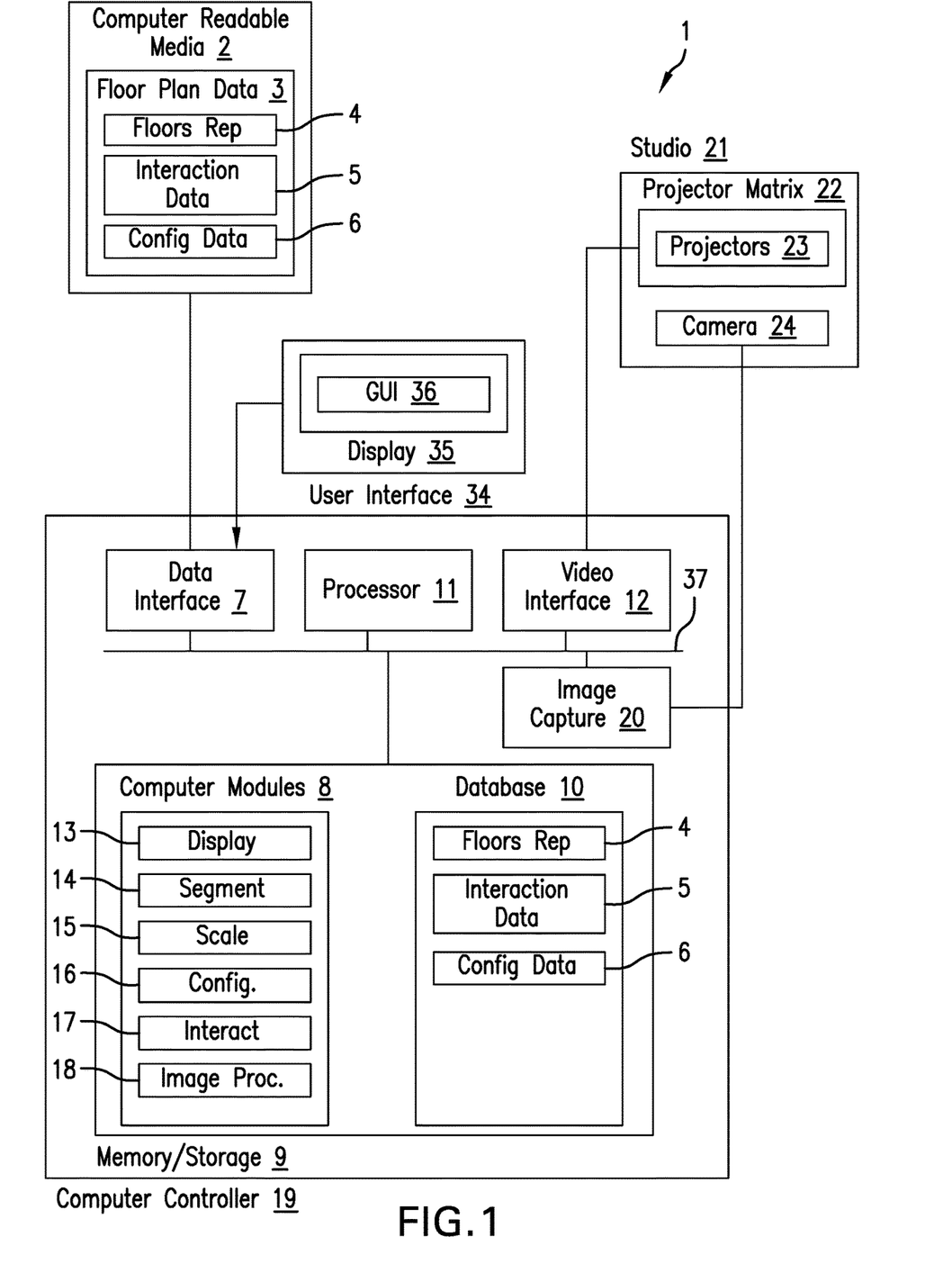
FIG. 1 shows a floorplan visualisation system in accordance with an embodiment of the present disclosure.

Turning now to FIG. 1, there is shown a functional and logical schematic of the system 1 for the visualisation of scaled floorplans.

As can be seen, the system 1 comprises a computer controller 19. As will be described in further detail below, the computer controller 19 is configured for performing the various computing tasks described herein, such as receiving floor plan data and projecting the floor plan data utilising at least one protector.

Figure 2:
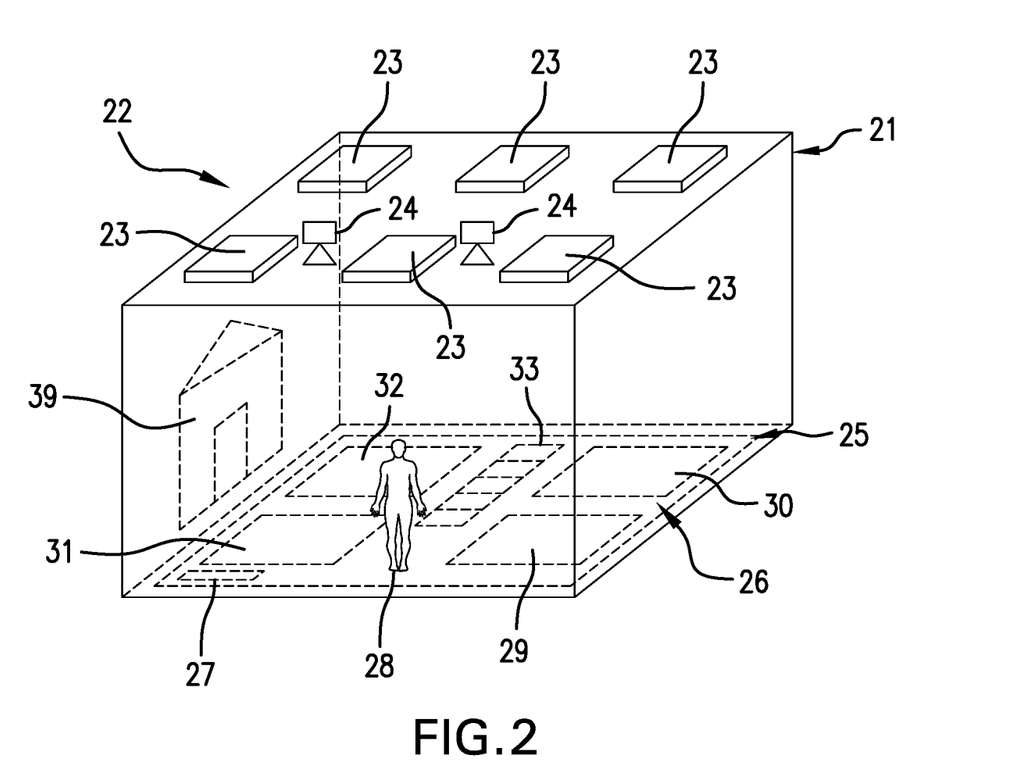
FIG. 2 shows an exemplary illustrator floorplan visualisation studio in accordance with an embodiment of the present disclosure.

Specifically, turning now to FIG. 2, there is shown an exemplary floorplan visualisation studio 21. As can be seen, the studio 21 comprises a plurality of ceiling mounted downward projecting projectors 23. The projectors project onto a floor projection surface 25, typically painted white for increased contrast. As can be seen, a user 28 stands on or adjacent the projection surface 25 so as to be able to visualise the projected floorplan 26 for pre-build inspection.

Turning again to FIG. 1, as can be seen, the controller 19 comprises a processor 11 for processing digital data. In operable communication with the processor 11 via data bus 37 is a memory/storage device 9.

The memory device 9 is configured for storing digital data including computer program code for execution by the processor 11. Specifically, the memory device 9 may comprise a plurality of computer modules 8 configured for implementing the various functionality described herein. Furthermore, the memory device 9 may comprise a database/datastore 10 for storing various data including that which is described herein.

In embodiments, the memory device 9 may take the form of, or a combination of, volatile RAM or nonvolatile ROM memory storage and hard drive storage, including physical and solid state hard drive storage.

The controller 19 further comprises a data interface 7. The data interface 7 is configured for receiving data from various peripheral componentry, including that which is described herein.

In one embodiment, the data interface 7 comprises a USB host controller but need not necessarily be limited so.

As is illustrated in FIG. 1, the data interface 7 is configured for reading data from a computer readable media 2, such as a USB drive or the like.

In this regard, and with reference to the embodiments described herein, the data interface 7 may be configured for receiving floor plan data 3 from the computer readable media 2 for the purposes of visualisation of the floorplans in the manner described herein.

As such, in use, the user 28 provides floorplan data 3 on a USB memory stick device or the like which may be plugged into the computer controller 19 for display purposes. However, it should be noted that the floor plan data 3 may be provided in other manners also.

The data interface 7 may be configured additionally for interacting with the user interface 34. For example, in embodiments, the user interface 34 may comprise a display device 35, such as a touchscreen LCD display device 35. In this regard, the display device 35 may display a graphical user interface 36 which may be utilised by the user 28 for interacting with the computer controller 19 in the manner described herein.

Furthermore, the computer controller 19 comprises a video interface 12 for outputting video data to at least one projector 23 located within the studio 21. In a preferred embodiment described herein, the system 1 comprises a matrix 22 of projectors 23 configured for the segmented display of floorplan data. As such, the view interface 12 may be a multi-output video interface 12 having respective outputs for each of the projectors 23.

In embodiments, the system 1 may be configured for user position determination for user interaction. In this regard, in an embodiment, the system 1 may comprise image capture devices 24 for capturing image data for image processing for identifying the position of the user 28 on the floor surface.

Now, having generally described the above technical architecture, the system 1 will now be described with reference to at least one exemplary embodiment primarily for illustrative purposes. It should be noted that these embodiments provided hereunder are exemplary only and that no technical limitation should necessarily be imputed to all of the embodiments accordingly.

Now, and with reference to FIG. 2, as alluded to above, a studio 21 may be provided for the purposes of the visualisation of floorplans. In this regard, the at least one projector 23 is ceiling mounted so as to protect downwardly onto a projection surface 25 within the studio 21. The projection surface 25 may comprise a high contrast coating, carpet or the like for enhancing the visualisation of the projected floorplans.

In various embodiments, the projection surface 25 may have dimensions of approximately 40×17 m$^2$ but, other dimensions may also be appropriate within the purposive scope of the embodiments described herein of allowing the user 28 to visualise the projected floorplans.

In a preferred embodiment shown in FIG. 2, the projectors 23 are arranged in a projector matrix 22. In this regard, each projector 22 may be configured for displaying a respective segment of the projected floorplan 26. In the embodiment shown, a matrix of 2×3 protectors 23 are provided but other matrix configurations may be applicable within the purposive scope of the embodiments described herein.

Furthermore, and as alluded to above, in embodiments, the system 1 may comprise at least one image capture device 24 for capturing image data of the user 28 from the projection surface 25 for user interaction purposes as will be described in further detail below.

As can be seen from FIG. 2, the floorplan 26 projected onto the projection surface 25 may display various elements of the floorplan 26 such as the bathroom 30, kitchen 29, bedroom 21 storage 32 and the like. Furthermore, in the embodiment shown, a stairwell 33 is provided. In this regard, in embodiments as alluded to above, the system 1 may be configured for in use user floorplan interaction. In these embodiments, the system 1 may determine when the user walks across the stairwell 33 so as to be able to transition floorplans to the next upper or lower levels.

Furthermore, as can also be seen from FIG. 2, the projected floorplan 26 may comprise a scale overlay 27 which may be referenced for adjusting the scale of the projected floorplan 26.

Now, having configured the studio 21 in the manner described above, a user 28 may wish to visualise floorplans 26 of a proposed building. In the embodiment described herein, the floorplans 26 comprise a number of floors for a multi-story building.

As such, the user 28 would load the floorplan data 3 onto a computer readable media 2, such as a USB memory stick or the like. As can be seen from FIG. 1, the floorplan data 3 may comprise floors 4 representing the plurality of floors. The floors 4 may be in differing formats. In one embodiment, the floors 4 are provided in PDF format. However, in other embodiments, the floors 4 may be provided in proprietary architecture software format for interpretation by the computer controller 19.

In embodiments, additional data may be loaded to the computer readable media 2 for the purposes of enhancing the user experience in the visualisation of the floorplan 26. Specifically, as can be seen, the floorplan data 3 may further comprise interaction data 5. Such interaction data 5 may be utilised for the purposes of user interaction in embodiments, as will be described in further detail below.

Furthermore, various configuration data 6 may also be provided in association with the floor data 4. Such configuration data 6 may configure various aspects including the manner in which the floors 4 are to be displayed such as the colouring, scale and the like. Furthermore, the configuration data 6 may configure the order of the floors 4 in height elevation order.

Arriving at the studio 21, the computer readable media 2 is inserted into the data interface 7 for reading.

The controller 19 may read the floorplan data 3 from the computer readable media 2 which may then be stored within the database 10. As can be seen, the database 10 may replicate the various data including storing the floors 4, interaction data 5 and configuration data 6.

It should be noted that, in embodiments, such data need not necessarily be stored within the database 10 in lieu of the controller 19 utilising the data directly on the computer readable media 2.

Now, as can be seen, the computer modules 8 may comprise a display module 13 for the purposes of displaying the floorplan 26. Specifically, the display module 13 converts the floorplan data 3 into an appropriate format for output via the video interface 12 for display by the projector matrix 22. As alluded to above, the display module 13 may act in accordance with the configuration data 6 specifying aspects such as the manner in which the floorplan 26 is to be displayed, the scaling of the floorplan and the like.

As can be seen, the computer modules 8 may further comprise a segmentation module 14 for segmenting the floorplan 26 across the various projectors 23. Specifically, in the embodiment shown in FIG. 2, a projector matrix 22 of six projectors 23 may be provided. In this regard, the segmentation module 14 may segment of the floorplan 26 into six corresponding segments for respective display by the six projectors 23.

In embodiments, the throw of the projectors 23 overlap and feather at the edges thereof with the throw of adjacent projectors. In this embodiment, the controller 19 may be configured for edge blending/feathering of the various segments such that the edge projection overlaps coincide.

The computer modules 8 may further comprise a scaling module 15 configured for scaling the floorplans 26 appropriately. In embodiments as alluded to above, the scaling module 15 may be configured for interpreting scaling data within the configuration data 6.

For example, the floorplan data 3 may specify a scale, and being configured in accordance with the dimensions of the projection surface level 25, the scaling module 15 is configured for scaling the floorplans appropriately such that the floorplan 26 scale to real-world dimensions.

As such, the projected floorplan items would appear to the user 20 standing on the projection surface 25 as being of a real-world size. As such, the user is able to visibly ascertain the sizing of the floorplans so as to be able to take remedial action if necessary in anticipation of building.

In embodiments, the scaling module 15 may interpret scale data of the floor plan representation such as by performing optical character recognition (OCR) and width measurements of scales displayed thereon. Alternatively, the scaling module 15 may interpret scaling meta data accompanying the representation data.

In embodiments, the computer modules 8 may comprise a configuration module 16 for allowing for the configuration of the projected floorplan 26. In one embodiment, the configuration module 16 is configured for allowing the user adjustment of the scaling of the projected floorplan 26.

For example, in the embodiment alluded to above, the display module 13 may be configured for overlaying a scale overlay 27 on the floorplan 26. Such a scale overlay 27 may have a set length, such as a length of 1 m or the like. As such, the user may place a physical object of the same dimension, such as a meter rule adjacent the scale overlay 27 so as to be able to adjust the scaling of the floorplan 26 accordingly. Specifically, should the length of the meter rule and the scale overlay 27 be incongruent, the user may utilise the user interface 34 to increase or decrease the scale of the project floorplan 26.

For example, the user interface 34 may display a scale adjustment control, such as a slider control, which the user may utilise to issue scale up and scale down adjustments wherein the scaling module 15 makes the necessary adjustments. As such, the user would adjust the scale adjustment controller until such time that the virtual scale overlay 27 coincides in length with the reference object.

In further embodiments, the system 1 may analyse image data captured by the image capture devices 24 to make image adjustments. For example, for a floorplan scale legend, the controller 19 may determine the actual projected length thereof on the floor surface of the studio utilising image data captured by the image capture devices 24 so as to make necessary adjustments. So as to be able to ascertain the appropriate scale of the floorplan scale legend, the controller may further implement OCR of the floorplan representations to read and interpret the appropriate scale.

In other embodiments, the configuration module 16 may allow the user to configure other aspects of the projected floorplan 26, such as colouring and the like. For example, the floorplan 26 may be displayed with white or black backgrounds. Such configuration may similarly be implemented by the user 28 utilising the user interface 34.

In embodiments, the computer controller 19 may be configured for in use user floorplan interaction. In this regard, the controller 19 may comprise an interaction module 17 configured for implementing the various user interactions described herein.

In one embodiment, the controller 19 may allow the user to switch between various floors 4 of the floorplan data 3.

For example, utilising the user interface in 34, the user 28 can switch between a plurality of candidate floorplans 26. In alternative embodiments the user 28 may switch between upper and lower floors utilising the user interface 34. For example, the user may initially view the ground floor and then subsequently view the first floor of a building plan.

In embodiments, the controller 19 may be configured for determining a position of the user 28 for the purposes of user interaction. In this regard, and as alluded to above, the studio 21 may comprise at least one camera 24 configured to capture an image of the user 28 so as to allow the controller 19 to determine the relative position of the user 28. In this regard, the computer modules 8 may comprise an image processor module 18 for interpreting the image data received by the image capture interface 20 for determining the position of the user. In other embodiments, other sensor types may be utilised for determining the location of the user.

Now, having determined the relative positioning of the user, in embodiments, the display module 13 may be configured for panning the floorplan 26 in accordance with the location of the user 28. For example, should the real world scale of the floorplan 26 exceed the available surface area of the projection surface 25, the display module 30 may be configured for panning the floorplan 26 as the user moves about the projection surface 25. For example, as the user 28 approaches an edge of the projection surface 25, the display module 13 may pan the floorplan 26 in the opposite direction away from the approached edge so as to allow the user to view 28 the formerlly clipped edge of the floorplan.

In alternative embodiments, the detected positioning of the user 28 may be utilised for the user interaction purposes. For example, in embodiments, the controller 19 may be configured for determining the coincidence of the user position and an interaction area.

Specifically, and as alluded to above, the projected stairwell 33 may be designated as an interaction area by the interaction data 5 of the floorplan data 3.

As such, as the controller 19 determines that the position of the user 28 coincides with the stairwell interaction area 33, the controller 19 may take on appropriate action such as transition to the next floor. As such, the user may approach the stairwell to visually walk up or down flights of stairs.

In embodiments, the configuration data 6 may comprise surface rendering data controlling how the floorplans 26 are to be projected. Specifically, the configuration data 6 may comprise various surface rendering swatches or the like which may be toggled or selected utilising the computer controller 19 such that the displayed floorplans 26 or updated accordingly. Specifically, in this embodiment, differing floor types, carpet types, colours and the like may be displayed substantially dynamically on the floorplan 26. The database 10 may comprise such rendering data that may be applicable to all floorplans provided.

The floorplan representation data 4 may comprise demarcation meta data demarcating various types of areas and therefore flooring of the floorplan representation. For example, the demarcation meta data may determine a corridor area as opposed to a kitchen area so as to allow the user to quickly switch between differing floor types, such as different types of carpet types for the corridor area and differing types of non-carpeted types for the kitchen area. In embodiments, the controller 19 may implement continuity analysis of the floorplans so as to be able to intelligently "fill" connected areas of the floorplans with a chosen floorplan type.

In further additional or alternative embodiments, the system 1 may be configured for displaying height elevation plan projections 39, wherein the elevation plan projections 39 may, in embodiments, be similarly drawn to scale. Specifically, where the studio 21 comprises sufficiently large walls, the projectors 23 may be arranged so as to project laterally onto the walls of the studio 21.

In such an embodiment, the user 28 is able to view height elevation plan projections 39, including of exteriors of proposed buildings.

For example, for a proposed house that is to be built, the user 28 may view the house elevation plan 34 against the studio wall 21. In this manner, the user may make modifications to the house if required, such as by changing the locations of exterior doors, windows, renders, facades and the like.

In this embodiment, the rendering of the house elevation plan 34 may further be configured in accordance with the configuration data 6 so as to allow the user to switch between differing exterior renders, paint finishes and the like.

In embodiments, the elevation plan projection 34 may represent an inside projection of the proposed building wherein, in embodiments, the projection of the elevation plan projections 39 has an interworking relationship with the projected floorplan 26 such that the elevation plan 34 projected corresponds, at its base, with the corresponding floorplans. As such, for example, for the kitchen 29 displayed within the floorplan projection 26, the user may additionally be able to view the elevation view of the interior of the kitchen 29 as is displayed by the elevation plan projection 34.

In embodiments, the elevation plan projection 34 may be generated dynamically by the computer controller 19 in accordance with the floorplan data 4 and the configuration data 6. For example, the computer controller 19 in accordance with the configuration data 6 may dynamically render the elevation plan projection 34 such as, for example, by dynamically generating the interior paint colour and dynamically allocating doors, windows, and other interior household features such as kitchen fittings and the like. In embodiments, the dynamic generation of the interior elevation plan projection 34 may be generated in accordance with user provided parameters (such as where, for example, the user was to specify the kitchen componentry type) and pseudorandom generated features, such as where the computer controller 19 randomly places various furniture, pot plants, picture paintings and the like.

In embodiments, partitions, barriers and false walls may be used to help the user visualise the depth of enclosed spaces. Such partitions may be aligned with the projected boundaries of the projected floor plans 26. The use of multiple projectors 23 may assist in the floorplan projections 26 being projected between the vertical partitions without substantial shadowing.

Additionally, physical and mobile furniture beds, cupboards, tables, chairs, lounges, TV units and the like may be placed at appropriate locations within the projected boundaries of the projected floorplans 26 to further assist the user visualisation process so as to be able to make informed decisions as to layout, lost space for furniture and the like. In alternative embodiments, virtual furniture objects may be projected by the controller 19 which may be "physically" grabbed by the user for relocation, either by utilising gestures which are detected by the cameras 24 or which are controlled using the touch sensitive display 24.

Furthermore, in embodiments, the computer controller 19 may be configured to add or remove projected lines from the projected floorplans 26 in substantial real time during the visualisation process.

Furthermore, the computer controller 19 may be configured to allow the taking of measurements. In one embodiment, the display 35 may be utilised for placing pointers, rulers or the like for the purposes of taking measurements. In alternative embodiments, a visually apparent ruler, measuring tape or the like may be placed across the projection surface 26 which is detected by the cameras 24 so as to be able to take measurements. For example, in one embodiment, the user may roll out a pink measuring tape across the projection surface 26 which is detected by the cameras 24. The controller 19 then take the measurement reading in accordance with the length of the detected tape measure and then protects the measurement reading adjacent the tape measure. In embodiments, area may also be correlated in a similar manner.

In further embodiments, the system 1 to receive writing gestures by the user interface 34 so as to be able to display corresponding writing on the floor surface. For example, the user interface 34 may take the form of a mobile computer device held by the user while walking the floor surface. As such, at appropriate locations, the user may virtually write and mark on the floor surface making appropriate marks on the user interface 34. For example, the user may make a marking where a wall should be moved.

In further embodiments, utilising similar gestures, the user may modify the displayed floor plan representation data utilising cut, move and place gestures. For example, the user may draw a bounding rectangle around a wall to be moved and then, utilising drag gestures, drag the selected area to a new area which may then be placed. As a result of such an editing process, the controller 19 may output modified floor plan representation data which may be utilised as a basis for amendments.

Furthermore, in embodiments, the controller 19 may be configured for the automated generation of design changes that have been decided upon during the visualisation process which may then be provided to architects, engineers, certifiers and the like for implementation.

Interpretation

Wireless

The invention may be embodied using devices conforming to other network standards and for other applications, including, for example other WLAN standards and other wireless standards. Applications that can be accommodated include IEEE 802.11 wireless LANs and links, and wireless Ethernet.

In the context of this document, the term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. In the context of this document, the term "wired" and its derivatives may be used to describe circuits, devices, systems, methods, techniques, communications channels, etc., that may communicate data through the use of modulated electromagnetic radiation through a solid medium. The term does not imply that the associated devices are coupled by electrically conductive wires.

Processes

Unless specifically stated otherwise, as apparent from the following discussions, it is appreciated that throughout the specification discussions utilizing terms such as "processing", "computing", "calculating", "determining", "analysing" or the like, refer to the action and/or processes of a computer or computing system, or similar electronic computing device, that manipulate and/or transform data represented as physical, such as electronic, quantities into other data similarly represented as physical quantities.

Processor

In a similar manner, the term "processor" may refer to any device or portion of a device that processes electronic data, e.g., from registers and/or memory to transform that electronic data into other electronic data that, e.g., may be stored in registers and/or memory. A "computer" or a "computing device" or a "computing machine" or a "computing platform" may include one or more processors.

The methodologies described herein are, in one embodiment, performable by one or more processors that accept computer-readable (also called machine-readable) code containing a set of instructions that when executed by one or more of the processors carry out at least one of the methods described herein. Any processor capable of executing a set of instructions (sequential or otherwise) that specify actions to be taken are included. Thus, one example is a typical processing system that includes one or more processors. The processing system further may include a memory subsystem including main RAM and/or a static RAM, and/or ROM.

Computer-Readable Medium

Furthermore, a computer-readable carrier medium may form, or be included in a computer program product. A computer program product can be stored on a computer usable carrier medium, the computer program product comprising a computer readable program means for causing a processor to perform a method as described herein.

Networked or Multiple Processors

In alternative embodiments, the one or more processors operate as a standalone device or may be connected, e.g., networked to other processor(s), in a networked deployment, the one or more processors may operate in the capacity of a server or a client machine in server-client network environment, or as a peer machine in a peer-to-peer or distributed network environment. The one or more processors may form a web appliance, a network router, switch or bridge, or any machine capable of executing a set of instructions (sequential or otherwise) that specify actions to be taken by that machine.

Note that while some diagram(s) only show(s) a single processor and a single memory that carries the computer-readable code, those in the art will understand that many of the components described above are included, but not explicitly shown or described in order not to obscure the inventive aspect. For example, while only a single machine is illustrated, the term "machine" shall also be taken to include any collection of machines that individually or jointly execute a set (or multiple sets) of instructions to perform any one or more of the methodologies discussed herein.

Additional Embodiments

Thus, one embodiment of each of the methods described herein is in the form of a computer-readable carrier medium carrying a set of instructions, e.g., a computer program that are for execution on one or more processors. Thus, as will be appreciated by those skilled in the art, embodiments of the present invention may be embodied as a method, an apparatus such as a special purpose apparatus, an apparatus such as a data processing system, or a computer-readable carrier medium. The computer-readable carrier medium carries computer readable code including a set of instructions that when executed on one or more processors cause a processor or processors to implement a method. Accordingly, aspects of the present invention may take the form of a method, an entirely hardware embodiment, an entirely software embodiment or an embodiment combining software and hardware aspects. Furthermore, the present invention may take the form of carrier medium (e.g., a computer program product on a computer-readable storage medium) carrying computer-readable program code embodied in the medium.

Carrier Medium

The software may further be transmitted or received over a network via a network interface device. While the carrier medium is shown in an example embodiment to be a single medium, the term "carrier medium" should be taken to include a single medium or multiple media (e.g., a centralized or distributed database, and/or associated caches and servers) that store the one or more sets of instructions. The term "carrier medium" shall also be taken to include any medium that is capable of storing, encoding or carrying a set of instructions for execution by one or more of the processors and that cause the one or more processors to perform any one or more of the methodologies of the present invention. A carrier medium may take many forms, including but not limited to, non-volatile media, volatile media, and transmission media.

Implementation

It will be understood that the steps of methods discussed are performed in one embodiment by an appropriate processor (or processors) of a processing (i.e., computer) system executing instructions (computer-readable code) stored in storage. It will also be understood that the invention is not limited to any particular implementation or programming technique and that the invention may be implemented using any appropriate techniques for implementing the functionality described herein. The invention is not limited to any particular programming language or operating system.

Means For Carrying Out a Method or Function

Furthermore, some of the embodiments are described herein as a method or combination of elements of a method that can be implemented by a processor of a processor device, computer system, or by other means of carrying out the function. Thus, a processor with the necessary instructions for carrying out such a method or element of a method forms a means for carrying out the method or element of a method. Furthermore, an element described herein of an apparatus embodiment is an example of a means for carrying out the function performed by the element for the purpose of carrying out the invention.

Connected

Similarly, it is to be noticed that the term connected, when used in the claims, should not be interpreted as being limitative to direct connections only. Thus, the scope of the expression a device A connected to a device B should not be limited to devices or systems wherein an output of device A is directly connected to an input of device B. It means that there exists a path between an output of A and an input of B which may be a path including other devices or means. "Connected" may mean that two or more elements are either in direct physical or electrical contact, or that two or more elements are not in direct contact with each other but yet still co-operate or interact with each other.

Embodiments

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the above description of example embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the Detailed Description of Specific Embodiments are hereby expressly incorporated into this Detailed Description of Specific Embodiments, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

Different Instances of Objects

As used herein, unless otherwise specified the use of the ordinal adjectives "first", "second", "third", etc., to describe a common object, merely indicate that different instances of like objects are being referred to, and are not intended to imply that the objects so described must be in a given sequence, either temporally, spatially, in ranking, or in any other manner.

Specific Details

In the description provided herein, numerous specific details are set forth. However, it is understood that embodiments of the invention may be practiced without these specific details. In other instances, well-known methods, structures and techniques have not been shown in detail in order not to obscure an understanding of this description.

Terminology

In describing the preferred embodiment of the invention illustrated in the drawings, specific terminology will be resorted to for the sake of clarity. However, the invention is not intended to be limited to the specific terms so selected, and it is to be understood that each specific term includes all technical equivalents which operate in a similar manner to accomplish a similar technical purpose. Terms such as "forward", "rearward", "radially", "peripherally", "upwardly", "downwardly", and the like are used as words of convenience to provide reference points and are not to be construed as limiting terms.

Comprising and Including

In the claims which follow and in the preceding description of the invention, except where the context requires otherwise due to express language or necessary implication, the word "comprise" or variations such as "comprises" or "comprising" are used in an inclusive sense, i.e. to specify the presence of the stated features but not to preclude the presence or addition of further features in various embodiments of the invention.

Any one of the terms: including or which includes or that includes as used herein is also an open term that also means including at least the elements/features that follow the term, but not excluding others. Thus, including is synonymous with and means comprising.

Scope of Invention

Thus, while there has been described what are believed to be the preferred embodiments of the invention, those skilled in the art will recognize that other and further modifications may be made thereto without departing from the spirit of the invention, and it is intended to claim all such changes and modifications as fall within the scope of the invention. For example, any formulas given above are merely representative of procedures that may be used. Functionality may be added or deleted from the block diagrams and operations may be interchanged among functional blocks. Steps may be added or deleted to methods described within the scope of the present invention.

Although the invention has been described with reference to specific examples, it will be appreciated by those skilled in the art that the invention may be embodied in many other forms.

The invention claimed is:

1. A floorplan visualisation system, the system comprising:
   a visualisation studio;
   a matrix of ceiling mounted edge-blended overlapping projectors projecting onto a floor surface of the visualisation studio;

a controller computer comprising:
  a user interface; and
  a video output operably coupled to the matrix of projectors for controlling the video projected from such, wherein, in use:
the controller computer is configured for:
  receiving floor plan representative data;
  segmenting the floor plan representation data into a plurality of display segments; and
  outputting the plurality of display segments to respective projectors, and
wherein the controller computer is configured to receiving scale adjustment commands via a scale adjustment control of the user interface and for adjusting the scale of the segments to display a floor plan representation on the floor surface to a real world scale, and
wherein as the user approaches an edge of a projection surface, the display module is configured to pan the floor plan in an opposite direction away from the approached edge so as to allow the user to view a formerly clipped edge of the floorplan.

2. The floorplan visualisation system as claimed in claim 1, further comprising a user position monitoring subsystem for detecting a position of a user on the floor surface.

3. The floorplan visualisation system as claimed in claim 2, wherein:
the system further comprises an image capture device and wherein the position of the user is determined utilising image processing of image data captured by the image capture device; and
the controller is configured for panning the floorplan representation according to the position of the user.

4. The floorplan visualisation system as claimed in claim 3, wherein the system analyses image data captured by the image capture devices to make image adjustments wherein the controller determines an actual projected length of a floorplan scale legend and adjusts the scale accordingly.

5. The floorplan visualisation system as claimed in claim 2, wherein the controller computer is further configured for receiving floor plan interaction data representative of at least one user interaction area on the floor plan representation and an associated interaction action, and, when detecting the coincidence of the position of the user and the at least one user interaction area, the controller computer is configured for implementing the associated interaction action, and wherein the associated interaction action comprises replacing the floor plan representation with another floor plan representation.

6. The floorplan visualisation system as claimed in claim 5, wherein the floor plan is arranged in height order and wherein, when reaching a particular interaction area, the displayed information is switched according to a height elevation order.

7. The floorplan visualisation system as claimed in claim 1, wherein the user interface is a touch sensitive user interface configured for receiving on-screen user gestures and wherein the controller is configured for projecting corresponding markings at respective locations of the floor plan representations.

8. The floorplan visualisation system as claimed in claim 1, wherein the user interface is a touch sensitive user interface configured for receiving on-screen cut and drag user gestures and wherein the controller is configured manipulating subregions of the floor plan representation according to the cut and drag user gestures.

9. The floorplan visualisation system as claimed in claim 1, wherein:
the controller computer is configured for augmenting regions of the floor plan representation with at least one of a texture and colour overlay, and
the controller computer comprises a database of overlays and wherein, in use, the controller computer is configured for receiving a selection of an overlay from the overlays via the user interface and augmenting a region of the floor plan representation utilising the selected overlay.

10. The floorplan visualisation system as claimed in claim 9, wherein the floor plan representative data comprises region representative meta data and wherein the controller computer is configured for overlaying a region represented by the region representative meta data with the overlay.

11. The floorplan visualisation system as claimed in claim 10, wherein the controller computer is configured for determining the region representative meta data utilising image analysis of the floor plan representative data.

12. The floorplan visualisation system as claimed in claim 1, wherein the controller computer comprises a database of object representations and wherein, in use, the controller computer is configured for receiving an object selection via the user interface and overlaying a representation of the object selection over the floorplan representation at a position specified using the user interface.

13. The floorplan visualisation system as claimed in claim 1, wherein the display module overlays a scale overlay for referencing against physical objects.

14. The floorplan visualisation system as claimed in claim 1, wherein a scaling module interprets a scale within the floor plan representation data and scales the floor plan appropriately.

15. The floorplan visualisation system as claimed in claim 1, wherein a scaling module interprets the scale data by performing optical character recognition and with measurements of scale is displayed therein.

16. The floorplan visualisation system as claimed in claim 1, further comprising a visually apparent tape configured to be placed across the projection surface and detectable by the cameras so as to be able to take measurements.

17. The floorplan visualisation system as claimed in claim 1, wherein an elevation plan projection is generated dynamically by the controller in accordance with the floorplan representation data and configuration data.

18. The floorplan visualisation system as claimed in claim 1, wherein the controller is configured for a dynamic generation of pseudorandom features.

* * * * *